(12) United States Patent
Kesler et al.

(10) Patent No.: US 6,987,655 B2
(45) Date of Patent: Jan. 17, 2006

(54) THERMAL OVERLOAD PROTECTION CIRCUIT FOR AN AUTOMOTIVE IGNITION SYSTEM

(75) Inventors: Scott B. Kesler, Kokomo, IN (US); Duane E. Beyler, Sharpsville, IN (US); John R. Fruth, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 215 days.

(21) Appl. No.: 10/287,033

(22) Filed: Nov. 4, 2002

(65) Prior Publication Data

US 2004/0085697 A1    May 6, 2004

(51) Int. Cl.
    *H02H 5/04*    (2006.01)
(52) U.S. Cl. .................... 361/103; 361/93.8
(58) Field of Classification Search ........... 361/100, 361/103, 93.8; 123/406.5
    See application file for complete search history.

(56) References Cited

U.S. PATENT DOCUMENTS

| | | | | |
|---|---|---|---|---|
| 4,368,717 A | * | 1/1983 | Roberts et al. | 123/632 |
| 4,669,026 A | * | 5/1987 | Widlar | 361/103 |
| 5,488,174 A | | 1/1996 | Drent et al. | |
| 5,611,318 A | | 3/1997 | Kesler | |
| 5,664,550 A | * | 9/1997 | Ito et al. | 123/630 |
| 5,781,047 A | * | 7/1998 | Shreve et al. | 327/110 |
| 5,819,713 A | * | 10/1998 | Kesler | 123/630 |
| 5,967,128 A | * | 10/1999 | Onuki et al. | 123/644 |
| 6,360,720 B1 | * | 3/2002 | Kesler | 123/406.55 |
| 6,414,832 B1 | | 7/2002 | Crecelius et al. | |
| 6,548,975 B2 | | 4/2003 | Kleinau et al. | |

FOREIGN PATENT DOCUMENTS

JP        08335522    * 12/1996

OTHER PUBLICATIONS

Horowitz et al. The Art of Electronics, 2001, Cambridge University Press, 335, 337-339.*

* cited by examiner

Primary Examiner—Brian Sircus
Assistant Examiner—Z Kitov
(74) Attorney, Agent, or Firm—Stefan V. Chmielewski

(57) ABSTRACT

Thermal overload protection circuitry 14 for an automotive ignition system includes a gate drive circuit (18) responsive to a control signal (ESTB) to produce a drive signal ($V_{GD}$) for driving a power switching device (22) separate from the protection circuitry (14), and a thermal overload protection circuit (40) configured to supply a first current (I1) to a thermal sensing component (38) associated with, and having an operating temperature defined by, the power switching device (22), wherein the first current (I1) has a magnitude defined by the operating temperature of the thermal sensing component (38). The first current is multiplied by a current controlled current source (60) to produce a second current (I2), and the second current is used to limit the drive signal ($V_{GD}$) to thereby maintain the operating temperature of the power switching device (22) below an operating temperature limit.

19 Claims, 4 Drawing Sheets

THERMAL OVERLOAD PROTECTION CIRCUIT FOR AN AUTOMOTIVE IGNITION SYSTEM

TECHNICAL FIELD

The present invention relates generally to automotive ignition control circuitry, and more specifically to such circuitry providing thermal overload protection via control of the operating temperature of the ignition coil driver device.

BACKGROUND OF THE INVENTION

Advances in electronics packaging techniques are allowing modern control electronics to be packaged with increasing density and to be placed into more hostile environments. In many cases, integrated electronic control circuits are being packaged with the high power switching transistors that they control. These packages are then included in higher level assemblies, often with other power dissipating elements. Examples of such systems are modern automotive ignition interface circuits that control the switching, monitoring, and control of ignition coil currents. These systems typically employ one or more high power switching devices, such as an Insulated Gate Bipolar Transistor (IGBT), power MOSFET, or the like, coupled to, and driven by, a low power ignition control circuit. These systems are often packaged in over-molded plastic packages which are then embedded in individual ignition coil packages. In operation, such systems generate heat mainly as a result of power being dissipated in the IGBT and/or other power switching devices during closed-loop controlled limiting of one or more ignition coil currents. The coils themselves also generate heat which may be transferred to the control electronics. Under some operating conditions, such as during excessively long "on" or "dwell" times, the operating temperatures of these electronic components can exceed maximum allowable levels, resulting in damage or destruction of the power switching device and/or ignition coils.

This invention is directed to a system and circuitry for dynamically regulating the temperature of a power switching device while maintaining the device operational so that the operating temperature thereof does not exceed a predefined temperature limit.

SUMMARY OF THE INVENTION

The present invention comprises one or more of the following features or combinations thereof. Thermal overload protection circuitry for an automotive ignition system including a first circuit responsive to a control signal to produce a drive signal for driving a power switching device separate from the protection circuitry, a second circuit defining a first current having a magnitude that varies as a function of an operating temperature of the power switching device and a third circuit limiting the drive signal as a function the magnitude of the first current to maintain the operating temperature of the power switching device below an operating temperature limit.

The second circuit is configured to supply the first current to an input of a thermal sensing component associated with the power switching device, wherein the thermal sensing device has an operating temperature defined by that of the power switching device. The thermal sensing component may define a first voltage drop thereacross that varies as a linearly decreasing function of temperature. The second circuit may include a diode having an anode defining a substantially temperature independent reference voltage and a cathode configured to supply the first current to the thermal sensing component, wherein the diode defines a second voltage drop thereacross, and a resistor configured to receive therethrough the first current from the thermal sensing component, wherein the magnitude of the first current is defined as a ratio of the reference voltage, less the first and second voltage drops, and a resistance value of the resistor.

The thermal sensing component may include at least one diode, and in one embodiment the thermal sensing component includes three series-connected diodes defining the first voltage diodes thereacross.

The power switching device may be responsive to the drive signal to conduct a coil current therethrough from an ignition coil, wherein the coil current conducted by the power switching device generates heat that affects the operating temperature of the thermal sensing component. The power switching device may be an insulated gate bipolar transistor or other semiconductor power switching device.

The third circuit may define a second current as a function of the first current, wherein the third circuit limits the drive signal as a function of the first current by drawing the second current from an output of the first circuit producing the drive signal. The third circuit may include a current mirror circuit defining the second current as a multiple of the first current.

These and other features of the present invention will become more apparent from the following description of the illustrative embodiments.

DESCRIPTION OF THE ILLUSTRATIVE EMBODIMENTS

Figure 1:
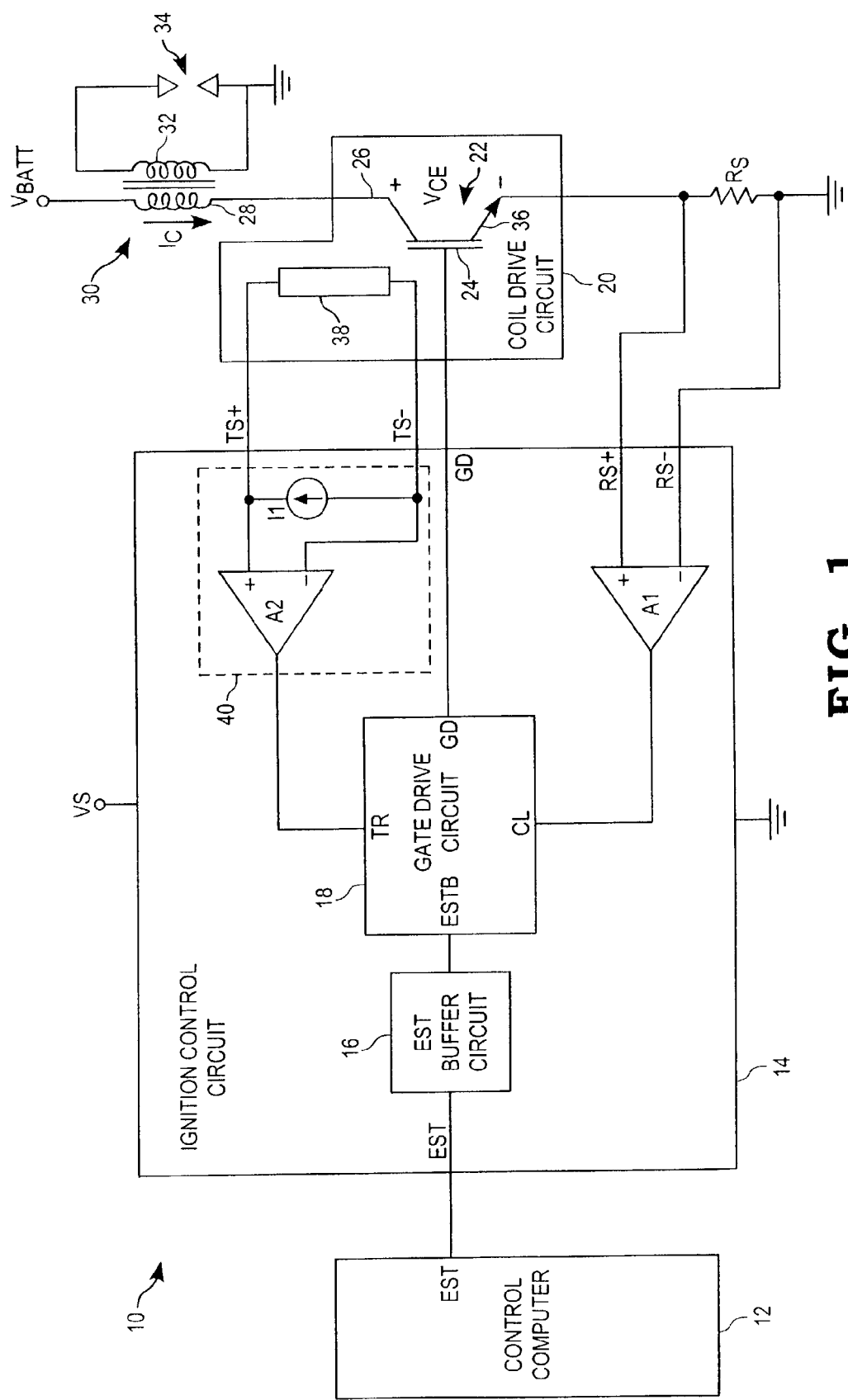
FIG. 1 is a high level schematic diagram of an automotive ignition system including a power switching device and an ignition control circuit having a thermal overload protection circuit operable to control operation of the power switching device to maintain its operating temperature below a maximum operating temperature limit.

Referring now to FIG. 1, a high level schematic diagram is shown illustrating one embodiment of an automotive ignition system 10 including a power switching device 22 and an ignition control circuit 14 having a thermal overload protection circuit 40 operable to control operation of the power switching device 22 to maintain its operating temperature below a maximum operating temperature limit. System 10 includes a control computer 12 producing an electronic spark timing (EST) signal, wherein the EST signal is provided to an EST input of the ignition control circuit 14. In one embodiment, the control computer 12 is a known control computer operable to control and manage the overall operation of an internal combustion engine, herein such a control computer may be known in the art as an engine control computer (ECC), engine control module (ECM) or the like. Alternatively, control computer 12 may be any known computer or other control circuit operable to produce the EST signal to thereby control the operation of one or more ignition plugs 34 of the engine. In any case, ignition control circuit 14 includes an electronic spark timing (EST) buffer 16 of known constriction and having an input receiving the EST signal from control computer 12. The output of the EST buffer 14 is connected to a buffered EST input, ESTB, of a gate drive circuit 18 having a gate drive output, GD, producing a gate drive signal, $V_{GD}$).

The gate drive output, GD, of the ignition control circuit 14 is connected to a control input 24 of a coil drive circuit 20 including a power switching device 22 and a thermal sensing device 38. In the embodiment illustrated in FIG. 1, the power switching device 22 is an insulated gate bipolar transistor (IGBT) defining a gate 24 connected to the gate drive output, GD, of circuit 14, a collector 26 connected to one end of a primary coil 28 of an automotive ignition coil 30 and an emitter 36. The opposite end of the primary coil 28 is connected to a suitable voltage source, such as automotive battery voltage, $V_{BATT}$, and the primary coil 28 is coupled to a secondary coil 32 having opposite ends connected across an ignition plug 34. IGBT 22 is responsive to a high-level gate drive signal, $V_{GD}$, at its gate 24 to conduct a coil current, $I_C$, therethrough from its collector 26 to its emitter 36, as is known in the art. Those skilled in the art will recognize that the coil driving device 22 may alternatively be, or include, other known coil driving devices, and examples of such alternative embodiments of device 22 may include, but are not limited to, a power metal-oxide semiconductor field effect transistor (power MOSFET), a bipolar power transistor circuit, a power relay device, or the like.

The emitter 36 of coil driving device 22 is connected to one end of a sense resistor, $R_S$, having an opposite end connected to ground potential. The emitter 36 is also connected to a non-inverting input of an error amplifier A1 of known construction and having an inverting input connected to ground potential or some other reference potential. The output of the error amplifier A1 is connected to a current limit input, CL, of the gate drive circuit 18.

Figure 2:
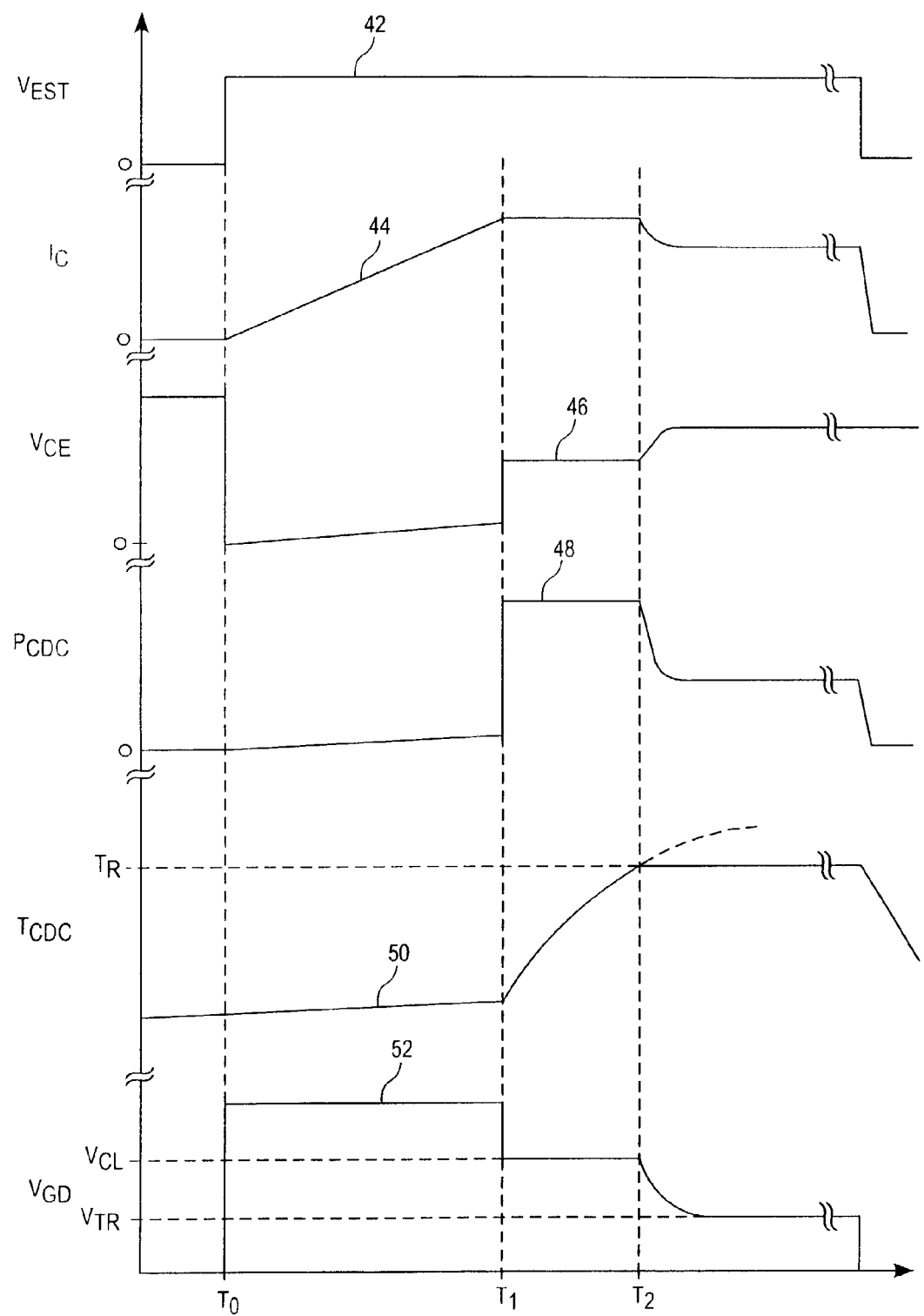
FIG. 2 is a plot of various operating conditions vs. time illustrating operation of the automotive ignition control system of FIG. 1 in controlling the operating temperature of the power switching device.

With the exception of the thermal sensing device 38 of the coil drive circuit 20, the circuitry described thus far is conventional, and the normal operation thereof is illustrated ill FIG. 2 by the $V_{EST}$, $I_C$ and $V_{GD}$ signals. For example, referring to FIG. 2, when the EST voltage, $V_{EST}$ 42, transitions from a low to a high state at time T0, the gate drive circuit 18 is responsive thereto to supply a high-level gate drive signal, $V_{GD}$ 52, to the gate of IGBT 22. IGBT 22 is, in turn responsive to the high-level gate drive signal, $V_{GD}$ 52, to begin conducting the coil current, $I_C$ 44, therethrough. Because the primary coil 28 is an inductive load, the coil current, $I_C$ 44, will rise linearly with a constant gate voltage, $V_{GD}$ 52, applied to the gate 24 of IGBT 22, and the voltage across the resistor $R_S$ will likewise rise linearly with $I_C$. As the voltage across $R_S$ rises, the output of the error amplifier A1 changes linearly, and the gate drive circuit 18 is responsive to the error amplifier output at the current limit input, CL, to correspondingly linearly decrease the gate drive voltage, $V_{GD}$ 52, to a level, $V_{CI}$ at which the coil current, $I_C$ 44, is limited to a constant, current-limited value at time T1.

When the gate drive voltage, $V_{GD}$ 52, is lowered by the gate drive circuit 18 at time T1 as just described, the collector-emitter saturation voltage, $V_{CE}$ 46, of the IGBT 22 increases substantially over what it was during the time interval T0–T1 when the coil current, $I_C$, was ramping up to its current limited value, as illustrated in FIG. 2. This causes the power, $P_{CDC}$ 48, dissipated by the IGBT 22 on board the coil drive circuit 20, which is the product of $V_{CE}$ and $I_C$, to also increase substantially at time T1. The power dissipated by IGBT 22 is generates heat, and the operating temperature, $T_{CDC}$ 50, of the IGBT 22 and of the coil driver circuit 20 thus increases rapidly at time T1 coincident with the substantial increase in power dissipation. Under some operating conditions, the operating temperature, $T_{CDC}$, if not controlled, could exceed the maximum safe operating temperature limit of the power switching device 22.

The thermal sensing device 38, associated with the coil drive circuit 20, acts to monitor the surface (active area) temperature of the power switching device 22, and is responsive to an input current to produce a voltage signal that decreases with increasing operating temperature of the power switching device 22. The thermal sensing device 38 may be attached to or integral with circuit 20, and while it is contemplated that the thermal sensing device 38 may be any known temperature sensitive device operable as just described, one particular thermal sensing device suitable for use as device 38 is described and illustrated in co-pending U.S. patent application Ser. No. 10/287,034, entitled INTEGRATED CIRCUIT INCLUDING SEMICONDUCTOR POWER DEVICE AND ELECTRICALLY ISOLATED THERMAL SENSOR, filed Nov. 4, 2002, which is assigned to the assignee of the present invention, and the disclosure of which is expressly incorporated herein by reference. This particular thermal sensing device comprises three series-connected diodes fabricated along with an IGBT on a single, monolithic integrated circuit. The series-connected string defines a composite diode voltage thereacross that decreases, substantially linearly, with increasing temperature of the power switching device 22, and an example utilizing such a thermal sensing device with the ignition control circuit 14 will be described hereinafter with respect to FIG. 4.

A thermal overload protection circuit 40, included within the ignition control circuit 14, includes a current source, I1, operable to bias the thermal sensing device 20 on board the coil drive circuit 20. An amplifier, A2, monitors the voltage developed across the thermal sensing device 38 and provides a temperature regulation signal to a temperature regulation input, TR, of the gate drive circuit 18 for dynamically controlling the gate voltage, $V_{GD}$. If the voltage developed across the thermal sensing device 38 falls below a predetermined voltage level indicative of a maximum allowable operating temperature, TR, of the power switching device 22, the gate drive circuit 18 is responsive to the resulting temperature regulation signal produced by the thermal overload protection circuit 40 to lower the gate drive signal, $V_{GD}$ 52, as illustrated at time T2 in FIG. 2. When the gate drive voltage, $V_{GD}$, is lowered at time T2, the load current, $I_C$ 44, flowing through the power switching device 22 is likewise lowered, thereby reducing the power, $P_{CDC}$ 48, dissipated by the power switching device 22 on board the coil drive circuit 20. The reduction in power dissipated by the power switching device 22 results in a reduction of its operating temperature, thereby allowing for stable thermal regulation of the power switching device 22. The gate drive voltage, $V_{GD}$, is reduced at time T2, in response to the voltage across the thermal sensing device 38 falling below the predetermined voltage level, until the power dissipated by the power switching device 22 is reduced to a level where the thermal energy generated in the power switching device 22 results in a constant operating temperature. This temperature is chosen so as not to exceed the maximum safe operating temperature of the power switching device 22, and in one embodiment the constant operating temperature is set at the maximum operating temperature, TR, of the power switching device, although other constant operating temperature values may be used. The particular power level required for such a power regulation point is dependent on a number of factors including thermal resistances present in the device packaging, and those skilled in the art will recognize that the package's thermal resistance must necessarily be taken into account in implementing the concepts of the present invention.

If the saturation voltage, $V_{CE}$, across the power switching device should thereafter begin to increase due to either an increase in supply voltage, $V_{BATT}$, across tie power switching device 22 and load 28, or due to the reduced gate drive voltage, $V_{GD}$, to the power switching device 22 resulting from the action of the thermal overload protection circuit 40, the resulting power dissipation and operating temperature increase in the power switching device 22 will cause the thermal overload protection circuit 40 and gate drive circuit 18 to dynamically further reduce the gate drive voltage, $V_{GD}$, in order to achieve a stable point of thermal regulation. This eliminates the need for monitoring of the supply voltage, $V_{BATT}$, or monitoring of changes in the load resistance that may occur due to temperature changes.

It should be understood that the operation of the thermal overload protection circuit 40 is independent from that of the coil current limiting circuitry $R_S$ and A1, although the influence of circuit 40 on the operation of the gate drive circuit 18 takes precedence over that of the coil current limiting circuitry in the event of a thermal overload condition. Also, since it is undesirable to create a spark at the ignition plug 34 at any time other than when commanded by the control computer 12, the thermal overload protection circuit 40 is configured to cause the reduction in coil current, $I_C$, to occur at a rate that is slow enough not to induce a spark at the ignition plug 34 connected to the secondary coil 32. This feature is accomplished by limiting the gain of the thermal control loop, as will be described in greater detail hereinafter.

Figure 3:
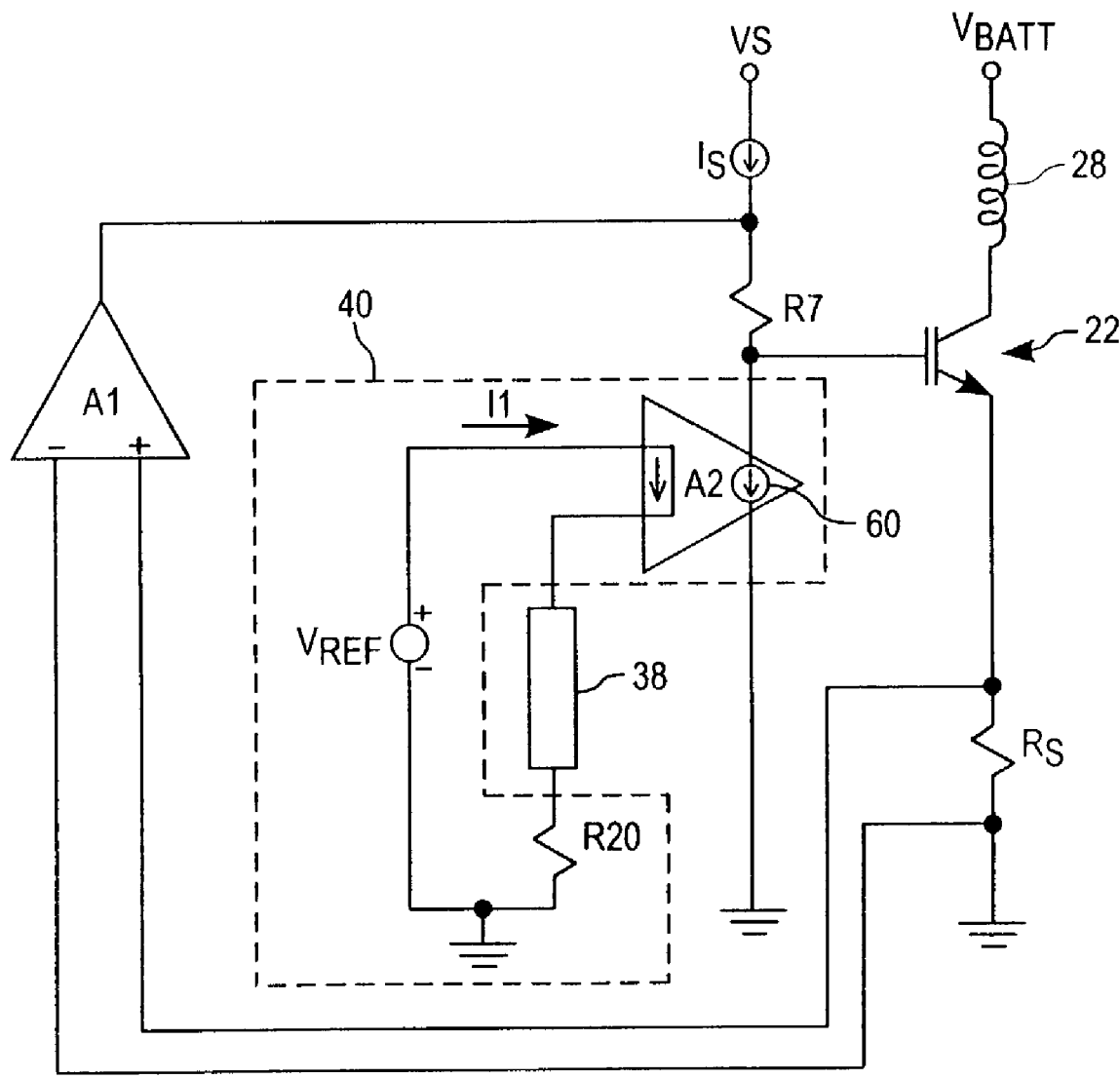
FIG. 3 is a high level schematic diagram of the thermal overload protection circuit illustrated in FIG. 1 as it relates to some of the components of the ignition control circuit and to some of the components of the automotive ignition system.

Referring noes to FIG. 3, a high level schematic diagram of the thermal overload protection circuit 40 illustrated in FIG. 1, as it relates to some of the components of the ignition control circuit 14 and to some of the components of the automotive ignition system 10, is shown. The thermal sensing device 38 is biased by voltage source $V_{REF}$, and the current, I1, through the thermal sensing device 38 is thus defined by the equation:

$$I1 = (V_{REF} - V_D)/R20 \quad (1),$$

Where $V_D$ is the voltage drop across the thermal sensing device 38. The current I1 is multiplied by a current-controlled current source 60 (CCCS) within A2, and the resulting current I2 is pulled away from the node connected to the gate of the power switching device 22. As the temperature of the power switching device 22 rises and the voltage, VD, across the thermal sensing device 38 decreases as described hereinabove, the current I1 through the thermal sensing device 38 and R20 increases. The resulting increase in the current I2 removed from the gate node eventually results in a balance being achieved between the current sourced by the gate drive current source $I_S$, and the current sunk by CCCS 60. The temperature at which this balance occurs is dependent upon the voltage chosen for $V_{REF}$, the current sourced by $I_S$ the value of R20, the temperature characteristics of the thermal sensing device 38, and the gain of the CCCS 60. If the temperature should continue to increase beyond this equilibrium point, the gate voltage on the power switching device 22 will be reduced, resulting in a reduction of load current, $I_C$, through the power switching device. As the power dissipated by the power switching device 22 is thereby reduced, the rise in the operating temperature of the power switching device 22 is halted and a stable operating temperature is maintained.

Figure 4:
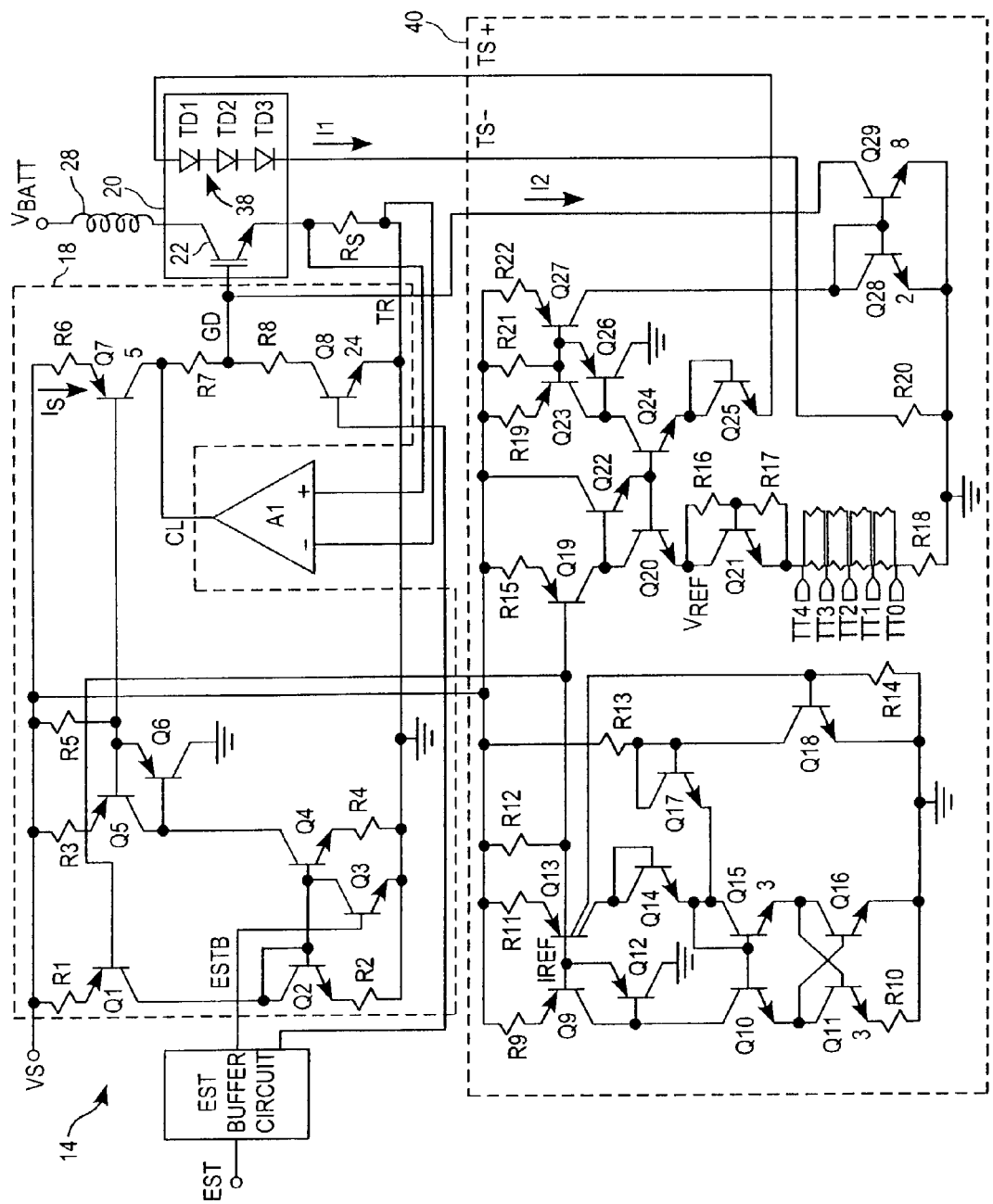
FIG. 4 is a device level schematic diagram of one illustrative embodiment of the gate drive circuit and thermal overload protection circuit, as well as some of the remaining components of the automotive ignition system of FIG. 1.

Referring now to FIG. 4, a device level schematic diagram of one illustrative embodiment of the ignition control circuit 14, including the thermal overload protection circuit 40, gate drive circuit 18, and some of the remaining components of the automotive ignition system 10 of FIG. 1, is shown. In FIG. 4 it should be noted that the thermal sensing device 38 is implemented as a series connection of three thermal sense diodes TD1–TD3, wherein the voltage, $V_D$, across the three diode stack TD1–TD3 decreases generally linearly with increasing operating temperature of the power switching device 22. In one embodiment, diodes TD1–TD3 are formed as polysilicon diodes fabricated on a single, monolithic integrated circuit along with the power switching device 22 in the form of an IGBT, as detailed in co-pending U.S. patent application Ser. No. 10/287,034, entitled INTEGRATED CIRCUIT INCLUDING SEMICONDUCTOR POWER DEVICE AND ELECTRICALLY ISOLATED THERMAL SENSOR, filed Nov. 4, 2002, which was previously incorporated herein by reference. In any case, transistors Q9–Q18 and resistors R9–R14 compose a reference current generator of the type known as a "Delta Vbe" generator. This type of circuit is a standard building block current familiar to those skilled in the art, and produces a reference current, IREF, having a slight positive temperature coefficient according to the equation:

$$IREF = Vt*ln(N)/R10 \quad (2)$$

where N is a constant defined by the ratio of emitter areas of the NPN transistors used to develop IREF (e.g, N=9 in the circuit 40 illustrated in FIG. 4), and Vt is the thermal voltage defined by the expression $(k \times T)/q$. In this expression "k" is Boltzman's constant, "T" is the temperature in degrees Kelvin, and "q" is the electronic charge. The magnitude of IREF is determined by the value of the resistor R10.

The reference current, IREF, is used to drive a current mirror rail that biases other circuitry within the thermal overload detection circuit 40, and also circuitry within the gate drive circuit 18 that establishes the gate drive source current, $I_S$. The gate drive source current, $I_S$, is developed by mirroring a copy of IREF, sourced by the collector of Q1, via the NPN current mirror composed of transistor Q2 and Q4 along with R2 and R4, onto transistor Q5. Q5 is in turn part of a PNP current mirror composed of Q5–Q7, R3 and R5–R6.

The gate drive source current, $I_S$, is the charging current used for turning on the power switching device 22, which is represented in FIG. 4 as an IGBT. Transistor Q3, driven by the buffered EST signal, ESTB, acts as a switch to enable or disable the gate drive output source current, $I_S$. When the ESTB signal commands the IGBT into the "off" state, transistor Q3 is turned on, thereby disabling the Q2–Q4 current mirror, and transistor Q8 is turned on, thereby pulling the gate of the IGBT low.

The current limit control circuitry described hereinabove includes resistor $R_S$ and the error amplifier A1. Error amplifier A1 responds to the voltage developed across $R_S$ resulting from the load current, $I_C$, flowing therethrough to dynamically control the gate voltage, $V_{GD}$, in a manner that limits the load current, $I_C$, to a constant and stable current-limited value. Resistor R7 acts to aid in the stability of this control loop.

A relatively temperature independent reference voltage, $V_{REF}$, can be developed by forcing the delta Vbe current, IREF, through the series combination of one or more diodes and a carefully selected integrated silicon diffused resistor. Silicon diffused resistors typically have positive temperature coefficients while the integrated diode forward voltage drops have a negative temperature coefficient. By combining the diode forward voltages and the voltage developed across the silicon diffused resistor with the delta-Vbe current, IREF, a voltage that is some multiple of the silicon bandgap voltage (approximately 1.26 volts) is developed. In the thermal overload protection circuit 40 illustrated in FIG. 4, a "Vbe multiplier" configuration was used in place of a fixed number of individual diodes in order to allow for adjustment of the thermal regulation set-point, TR. Transistor Q21, combined with R16 and R17, forms this Vbe multiplier, wherein the voltage, $V_{CE,\ Q21}$ across the collector and emitter terminals of Q21 is defined by the equation:

$$V_{CE,\ Q21} = Vbe_{Q21} * (1 + R16/R17) \quad (3).$$

This voltage is in series with the voltage drop formed across R18 and the trim resistor TT4–TT0 such that the substantially temperature independent reference voltage, $V_{REF}$, is defined by the equation:

$$V_{REF} = V_{CE,\ Q21} + IREF*R18 + IREF*R_{TT4-TT0} \quad (4),$$

wherein $R_{TT4-TT0}$ represents the resistance of the trim resistor TT4–TT0. It will be understood that by proper of values for R16, R17, and R18 a voltage reference, $V_{REF}$, with any desired magnitude and temperature coefficient can be developed at the emitter of Q20, wherein the calculations necessary to accomplish this setup can be made by one skilled in the art. This reference voltage, $V_{REF}$, is transferred to the collector-base of diode-tied Q25 via the biased base-emitter junctions of transistors Q20 and Q24. In order to develop a temperature regulation point, TR, at a substantially high temperature where the total voltage drop across the string of thermal diodes, TD1–TD3, is relatively low, the voltage across tie base-emitter junction of Q25 is used to offset one Vbe voltage component of the voltage, $V_{CE,\ Q21}$, developed across collector and emitter of Q21. This allows a reference voltage, $V_{REF}$, with a magnitude of less than one silicon bandgap voltage to be applied to the diode string TD1–TD3. By inserting the string of trim resistors, TT4–TT0, with shorting fuses in series with R18, the overall thermal regulation point, TR, can be modified as desired for a given application.

The current, I1, directed by Q25 through the series-connected thermal sense diodes, TD1–TD3, is defined by the equation:

$$I1 = (V_{REF} - Vbe_{Q25} - 3*Vtd)/R20 \quad (5),$$

where Vtd is the forward voltage drop across any one of the thermal sense diodes TD1–TT3 ($3 * Vtd = V_D$). In addition to being one of several variables that establish the current flowing through the thermal diodes, R20 also acts to compensate the thermal regulation point, TR, for changes in silicon resistor processing. Should the resistor sheet resistance decrease, the decrease in R20 will compensate for the resulting increase in the gate drive current, $I_S$, sourced by Q7 ($I_S$ is directly proportional to the current established by integrated resistor R10 as described above.)

The current, I1, established in the thermal sense diodes TD1–TD3 is supplied by Q23 via Q24, and I1 acts as a drive current to the PNP current mirror composed of Q23, Q26, and Q27 along with R19 and R22. The collector current of Q27, in turn, becomes the drive current for the current mirror composed of Q28 and Q29. The collector current of Q29, I2, sinks current away from the gate drive output, GD, of the gate drive circuit 18. The magnitude of I2 relative to I1 can be manipulated by controlling the gain in the aforementioned current mirrors by ratioing the areas of the paired transistors or the values of the corresponding emitter resistors.

Thermal regulation occurs at the temperature, TR, at which the gate drive source current, $I_S$, minus any current consumed by the error amplifier, A1, equals the current, I2, pulled away from the gate drive output, GD, of the gate drive circuit 18. If the gate voltage, $V_{GD}$, is higher than required for thermal regulation, the temperature of the IGBT 22 will continue to increase beyond TR (as illustrated by the curved dashed line at time T2 in the $T_{CDC}$ plot 50 of FIG. 2), resulting in a decrease in the forward voltage drop, $V_D$, across the thermal sense diodes TD1–TD3. This subsequently results in an increase in current, I2, pulled away from the gate drive output, GD, of the gate drive circuit 18, so that a reduction in $V_{GD}$ occurs (e.g., to a level $V_{TR}$ as illustrated at time T2 in the $V_{GD}$ plot 52 of FIG. 2) thereby reducing the load current, $I_C$, through the IGBT 22 (as illustrated by the reduction in $I_C$ 44 at time T2 in FIG. 2). Reducing the load current, $I_C$, increases the saturation voltage, $V_{CE}$, (as illustrated at time T2 in the $V_{CE}$ plot 46 of FIG. 2), which together reduce the power dissipated by the IGBT 22 (as illustrated at time T2 in the $P_{CDC}$ plot 48 of FIG. 2), and therefore halts the temperature rise of IGBT 22. The thermal time constant of the IGBT 22, as typically mounted on a thermal mass or heat sink, is of substantial length so as to impart natural stability to the system.

Correct setup of the thermal regulation temperature, TR, requires an understanding of the magnitude of each of the component currents discussed above. The calculations required to compensate for the temperature coefficients of each of the circuit elements discussed above can be performed by one skilled in the art once the individual temperature coefficients are known.

The following TABLE 1 sets forth example resistor values used in one implementation of the circuits 14 and 40 illustrated in FIG. 4, although those skilled in the art will recognize that such resistor values are only provided by way of example, and that other implementations of the circuits 14 and 40 may require different resistor values.

TABLE 1

| Resistor | Value (ohms) |
| --- | --- |
| R1 | 2k |
| R2 | 2k |
| R3 | 2k |
| R4 | 2k |
| R5 | 50k |
| R6 | 400 |
| R7 | 300 |
| R8 | 300 |
| R9 | 2k |
| R10 | 429 |
| R11 | 2k |
| R12 | 30k |
| R13 | 100k |
| R14 | 25k |
| R15 | 2k |

TABLE 1-continued

| Resistor | Value (ohms) |
|---|---|
| R16 | 18.75k |
| R17 | 25k |
| R18 | 3871 |
| R19 | 10k |
| R20 | 1k |
| R21 | 50k |
| R22 | 5.8k |
| $R_S$ | 0.01 |

While the invention has been illustrated and described in detail in the foregoing drawings and description, the same is to be considered as illustrative and not restrictive in character, it being understood that only example embodiments thereof have been shown and described and that all changes and modifications that come within the spirit of the invention are desired to be protected.

What is claimed is:

1. Thermal overload protection circuitry for an automotive ignition system, the circuitry comprising:
 a first circuit responsive to a control signal to produce a drive signal for driving a power switching device separate from the protection circuitry;
 a second circuit configured to supply a first current to a thermal sensing component associated with, and having an operating temperature defined by, the power switching device, the first current having a magnitude defined by the operating temperature of the thermal sensing component; and
 a third circuit limiting the drive signal as a function of the magnitude of the first current to maintain the operating temperature of the power switching device below an operating temperature limit while the power switching device is in a current limited conducting state.

2. The circuitry of claim 1 wherein the thermal sensing component defines a first voltage drop thereacross that varies as a function of temperature.

3. The circuitry of claim 2 wherein the second circuit includes:
 a diode having an anode defining a substantially temperature independent reference voltage and a cathode configured to supply the first current to the thermal sensing component, the diode defining a second voltage drop thereacross; and
 a resistor configured to receive therethrough the first current from the thermal sensing component, the magnitude of the first current defined as a ratio of the reference voltage, less the first and second voltage drops, and a resistance value of the resistor.

4. The circuitry of claim 3 wherein the thermal sensing component includes at least one diode;
 and wherein the first voltage drop is a linearly decreasing function of temperature.

5. The circuitry of claim 4 wherein the thermal sensing component includes three series-connected diodes defining the first voltage drop thereacross.

6. The circuitry of claim 1 wherein the power switching device is responsive to the drive signal to conduct a coil current through an ignition coil, the coil current conducted by the power switching device generating heat that affects the operating temperature of the thermal sensing component.

7. The circuitry of claim 6 wherein the power switching device is an insulated gate bipolar transistor.

8. The circuitry of claim 1 wherein the third circuit defines a second current as a function of the first current, the third circuit limiting the drive signal as a function of the first current by drawing the second current from an output of the first circuit producing the drive signal.

9. The circuitry of claim 8 wherein the third circuit includes a current mirror circuit defining the second current as a multiple of the first current.

10. Thermal overload protection circuitry for an automotive ignition system, the circuitry comprising:
 a first circuit responsive to a control signal to produce a drive signal for driving a power switching device separate from the protection circuitry;
 a second circuit defining a first current having a magnitude that varies as a function of an operating temperature of the power switching device while the power switching device is in a current limited conducting state; and
 a third circuit limiting the drive signal as a function of the magnitude of the first current to maintain the operating temperature of the power switching device below an operating temperature limit.

11. The circuitry of claim 10 wherein the second circuit is configured to supply the first current to an input of a thermal sensing component associated with the power switching device, wherein the thermal sensing device has an operating temperature defined by that of the power switching device.

12. The circuitry of claim 11 wherein the thermal sensing component defines a first voltage drop thereacross that varies as a linearly decreasing function of temperature.

13. The circuitry of claim 12 wherein the second circuit includes:
 a diode having an anode defining a substantially temperature independent reference voltage and a cathode configured to supply the first current to the thermal sensing component, the diode defining a second voltage drop thereacross; and
 a resistor configured to receive therethrough the first current from the thermal sensing component, the magnitude of the first current defined as a ratio of the reference voltage, less the first and second voltage drops, and a resistance value of the resistor.

14. The circuitry of claim 13 wherein the thermal sensing component includes at least one diode.

15. The circuitry of claim 13 wherein the thermal sensing component includes three series-connected diodes defining the first voltage drop thereacross.

16. The circuitry of claim 10 wherein the power switching device is responsive to the drive signal to conduct a coil current through an ignition coil, the coil current conducted by the power switching device generating heat that affects the operating temperature of the thermal sensing component.

17. The circuitry of claim 16 wherein the power switching device is an insulated gate bipolar transistor.

18. The circuitry of claim 10 wherein the third circuit defines a second current as a function of the first current, the third circuit limiting the drive signal as a function of the first current by drawing the second current from an output of the first circuit producing the drive signal.

19. The circuitry of claim 18 wherein the third circuit includes a current mirror circuit defining the second current as a multiple of the first current.

* * * * *